(12) United States Patent
Li et al.

(10) Patent No.: US 8,227,944 B2
(45) Date of Patent: Jul. 24, 2012

(54) VERTICAL BUS CIRCUITS

(75) Inventors: Guoxing Li, Sunnyvale, CA (US);
Liusheng Liu, San Jose, CA (US)

(73) Assignee: O2Micro Inc, Santa Clara, CA (US)

( * ) Notice: Subject to any disclaimer, the term of this patent is extended or adjusted under 35 U.S.C. 154(b) by 36 days.

(21) Appl. No.: 12/645,953

(22) Filed: Dec. 23, 2009

(65) Prior Publication Data

US 2011/0001357 A1   Jan. 6, 2011

Related U.S. Application Data

(60) Provisional application No. 61/142,685, filed on Jan. 6, 2009, provisional application No. 61/142,689, filed on Jan. 6, 2009.

(51) Int. Cl.
  *H02J 7/00*      (2006.01)
(52) U.S. Cl. ........................................ 307/150
(58) Field of Classification Search .......... 307/150
  See application file for complete search history.

(56) References Cited

U.S. PATENT DOCUMENTS

| | | | |
|---|---|---|---|
| 4,580,261 A | 4/1986 | Pelotte | |
| 4,716,354 A | 12/1987 | Hacker | |
| 4,723,241 A | 2/1988 | Grobel et al. | |
| 4,773,005 A | 9/1988 | Sullivan | |
| 4,962,378 A | 10/1990 | Fadem | |
| 5,423,050 A | 6/1995 | Taylor et al. | |
| 5,504,413 A | 4/1996 | Fernandez et al. | |
| 5,701,068 A | 12/1997 | Baer et al. | |
| 5,841,996 A | 11/1998 | Nolan et al. | |
| 5,850,351 A | 12/1998 | Lotfy et al. | |
| 5,974,475 A | 10/1999 | Day et al. | |
| 6,031,354 A | 2/2000 | Wiley et al. | |
| 6,094,053 A | 7/2000 | Harvey | |
| 6,172,479 B1 | 1/2001 | Barton | |
| 6,281,684 B1 | 8/2001 | James | |
| 6,404,166 B1 * | 6/2002 | Puchianu | ............... 320/116 |
| 6,462,510 B1 | 10/2002 | Takada et al. | |
| 6,611,774 B1 | 8/2003 | Zaccaria | |
| 6,762,588 B2 | 7/2004 | Miyazaki et al. | |
| 7,020,076 B1 | 3/2006 | Alkalai et al. | |
| 7,023,845 B1 | 4/2006 | Simons et al. | |
| 7,034,540 B2 | 4/2006 | Anzawa et al. | |
| 7,466,104 B2 | 12/2008 | Wang et al. | |
| 7,489,030 B2 | 2/2009 | Shibata et al. | |
| 7,511,457 B2 | 3/2009 | Emori et al. | |

(Continued)

FOREIGN PATENT DOCUMENTS

CN    1319189 A    10/2001

(Continued)

OTHER PUBLICATIONS

EP search report received in Europe Application No. 10150165.8 dated Oct. 18, 2010.

*Primary Examiner* — Robert L. Deberadinis

(57) ABSTRACT

A vertical bus circuit includes multiple devices for transmitting signals between the bus devices. The multiple devices share multiple common voltage levels. Each of the devices includes a bus block and two input/output (I/O) devices powered by a first voltage level and a second voltage level of the common voltage levels, respectively. The bus block enables signal transmission between the two I/O devices, and the common voltage levels enable the signal transmission between the devices.

20 Claims, 10 Drawing Sheets

U.S. PATENT DOCUMENTS

| | | |
|---|---|---|
| 7,615,966 B2 | 11/2009 | Houldsworth et al. |
| 2001/0037482 A1 | 11/2001 | Plants |
| 2004/0019441 A1 | 1/2004 | Larson |
| 2004/0164706 A1 | 8/2004 | Osborne |
| 2004/0225810 A1 | 11/2004 | Hiratsuka |
| 2005/0275389 A1 | 12/2005 | Cordoba |
| 2006/0072262 A1 | 4/2006 | Paik et al. |
| 2006/0136609 A1 | 6/2006 | Vladimir |
| 2006/0259280 A1 | 11/2006 | Zaccaria |
| 2007/0182377 A1 | 8/2007 | Vandensande |
| 2009/0144471 A1 | 6/2009 | Lin |

FOREIGN PATENT DOCUMENTS

| | | |
|---|---|---|
| JP | 2001-307782 A | 11/2001 |
| JP | 2003-111297 A | 4/2003 |
| JP | 2005-033951 A | 2/2005 |
| JP | 2007-158237 A | 6/2007 |
| JP | 2007-252175 A | 9/2007 |
| JP | 2009-027916 A | 2/2009 |
| WO | 9527358 A1 | 10/1995 |
| WO | 0005596 A1 | 2/2000 |
| WO | 2006068429 A1 | 6/2006 |

* cited by examiner

VERTICAL BUS CIRCUITS

RELATED APPLICATION

This application claims priority to U.S. Provisional Application No. 61/142,685, filed on Jan. 6, 2009, and U.S. Provisional Application No. 61/142,689, filed on Jan. 6, 2009, which are hereby incorporated by reference in their entirety.

BACKGROUND

Currently, Li-ion batteries have been used in green vehicles, such as electric vehicles (EVs) and hybrid electric vehicles (HEVs). The workable voltage of a single cell in a Li-ion battery is approximately 3-4 volts, but EVs and HEVs usually require higher voltages up to more than 100 volts. Usually, multiple cells are coupled to each other in series to drive EVs and HEVs.

For battery management, a number of cells are arranged as one or more battery packs, and an analog front end (AFE) device is coupled to each battery pack to assess the status of the battery packs or the cells, such as their voltage and temperature. Digital data indicating the status of the battery packs or the cells is transferred to a microprocessor for various purposes such as battery protection. A communication bus between the microprocessor and each AFE device is also needed.

FIG. 1 shows a conventional battery management system 100 with an opto-coupler based vertical bus. The AFE devices 122, 124 and 126 are coupled to the battery packs 112, 114, and 116, respectively, for accessing the status of each cell in the battery packs. Opto-coupler blocks 132, 134, and 136 establish a communication bus between the AFE devices 122, 124, and 126 and a central electronics control unit (CECU) 140. Each opto-coupler block includes two opto-couplers for each wire of the bus.

The conventional battery management system 100 with an opto-coupler based vertical bus suffers from high cost and high power consumption since opto-couplers are relatively expensive and their driving capability requires mille-amperes of current.

SUMMARY

In one embodiment, a vertical bus circuit includes multiple devices for transmitting signals between the bus devices. The multiple devices share multiple common voltage levels. Each of the devices includes a bus block and two input/output (I/O) devices powered by a first voltage level and a second voltage level of the common voltage levels, respectively. The bus block enables signal transmission between the two I/O devices, and the common voltage levels enable the signal transmission between the devices.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Figure 1:
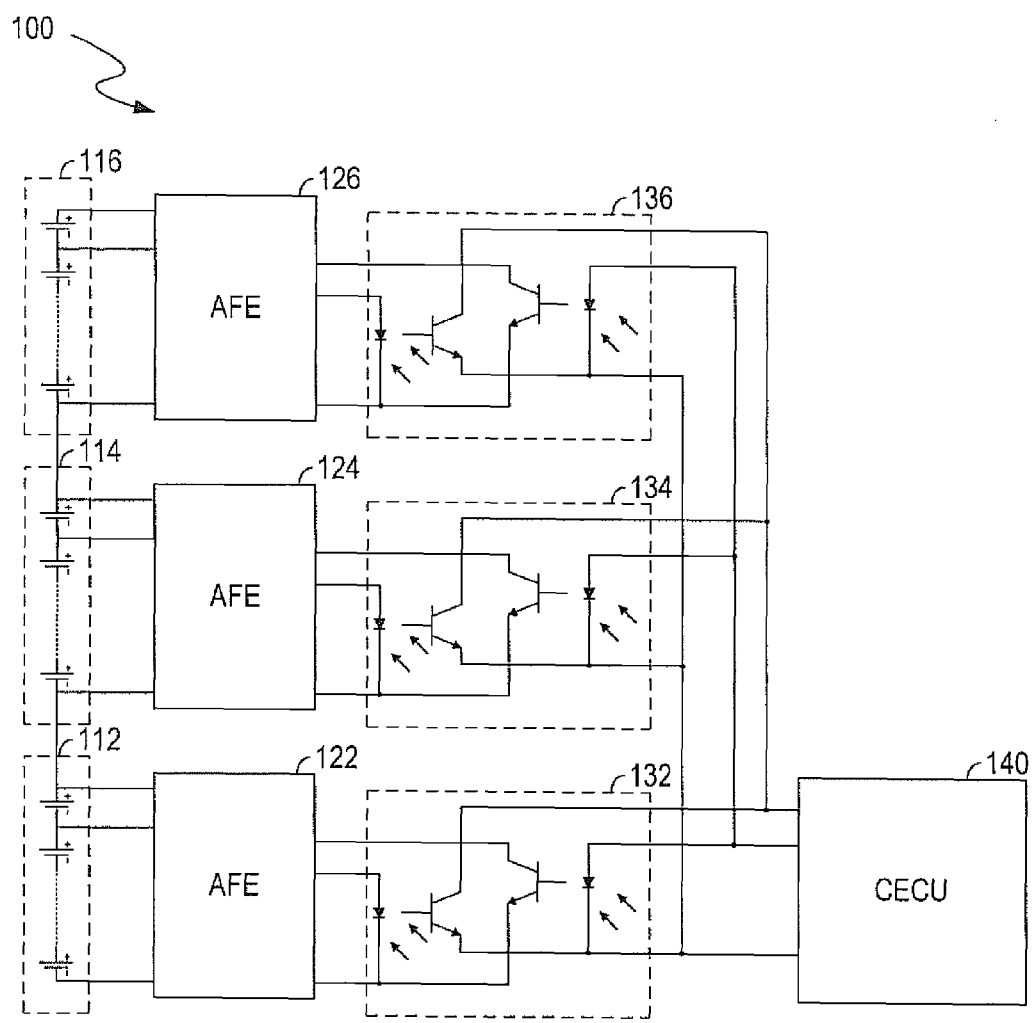
FIG. 1 shows a conventional battery management system with an opto-coupler based vertical bus.

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Embodiments described herein may be discussed in the general context of computer-executable instructions residing on some form of computer-usable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "transmitting," "issuing," "accessing," "converting," "using," "powering" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

By way of example, and not limitation, computer-usable media may comprise computer storage media and communication media. Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information.

Communication media can embody computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency (RF), infrared and other wireless media. Combinations of any of the above should also be included within the scope of computer-readable media.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 2:
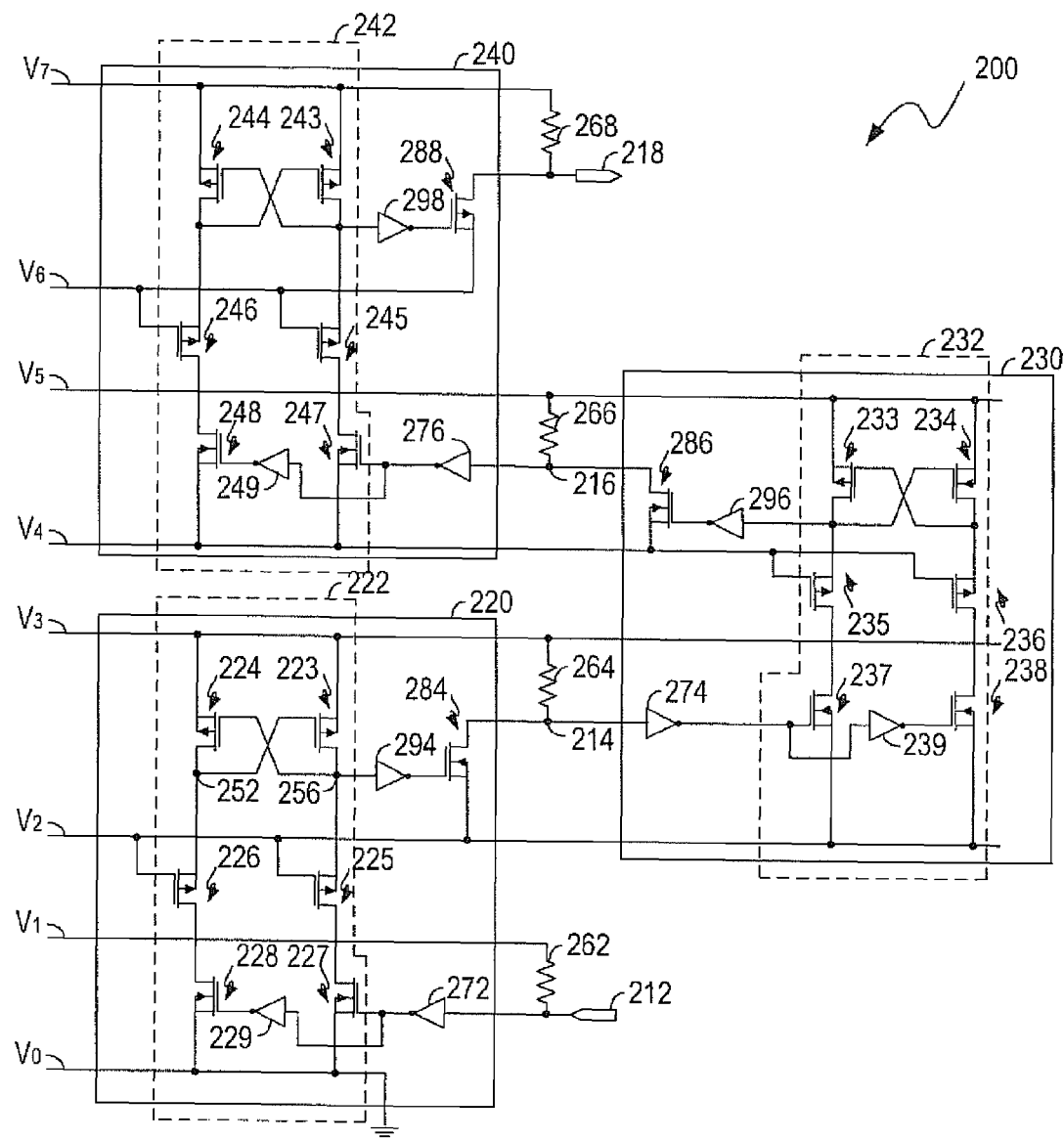
FIG. 2 shows a vertical bus circuit according to one embodiment of the present invention.

FIG. 2 shows a vertical bus circuit 200 according to one embodiment of the present invention. The vertical bus circuit 200 includes three bus blocks 220, 230, and 240 and multiple resistors 262, 264, 266, and 268. As shown in FIG. 2, the bus blocks 220, 230, and 240 are similar to each other. Although three bus blocks are shown in FIG. 2, the present invention is not so limited. In other embodiments, the vertical bus circuit 200 may include more than three or less than three bus blocks.

The bus blocks 220, 230, and 240 may each utilize a different voltage. Taking the bus block 220 as an example, a bus signal is input into an input port 212 of the bus block 220 and transmitted to the bus block 230. At the input port 212 of the bus block 220, the low level voltage is $V_0$ and the high level voltage is $V_1$. When the bus signal is transmitted to the bus block 230 at a node 214, the low level voltage is $V_2$ and the high level voltage is $V_3$, where $V_2$ and $V_3$ are different from $V_0$ and $V_1$, respectively. Similarly, the bus signal can be transmitted from the bus block 230 to the bus block 240.

The bus blocks 220, 230, and 240 transmit a bus signal in the upward direction (with respect to the orientation of FIG. 2). For example, in the vertical bus circuit 200, the bus block 220 is a bottom bus block and the bus block 240 is a top bus block. A bus signal is input into an input port 212 of the bus block 220, and the bus signal is transmitted to the bus block 240 and output from an output port 218 of the bus block 240.

The bus block 220 includes an upward signal path 222, inverter gates 272 and 294, and a FET 284, in one embodiment. The upward signal path 222 includes FETs 223, 224, 225, 226, 227 and 228, and an inverter gate 229, in one embodiment. The combined circuit of the FETs 223, 224, 225, 226, 227 and 228 can be referred to as a differential circuit. The bus block 230 includes an upward signal path 232, inverter gates 274 and 296, and a FET 286. The upward signal path 232 includes FETs 233, 234, 235, 236, 237, and 238, and an inverter gate 239. The bus block 240 includes an upward signal path 242, inverter gates 276 and 298, and a FET 288. The upward signal path 242 includes FETs 243, 244, 245, 246, 247, and 248, and an inverter gate 249.

The upward signal paths 222, 232, and 242 in the bus blocks 220, 230, and 240 translate (increase or shift) the bus signal from a low voltage level to a high voltage level. For example, the signal path 222 in the bus block 220 translates the bus signal from a low voltage level (VDD=$V_1$, GND=$V_0$) to a high voltage level (VDD=$V_3$, GND=$V_2$).

The inverter gate 294 and the FET 284 of the bus block 220, and the resistor 264 and the inverter gate 274 of the bus block 230, transmit the bus signal from the bus block 220 to the bus block 230, in one embodiment. Similarly, the inverter gate 296 and the FET 286 of the bus block 230, and the resistor 266 and the inverter gate 276 of the bus block 240, transmit the bus signal from the bus block 230 to the bus block 240, in one embodiment.

When the bus signal that is input at the input port 212 of the bus block 220 is in a high state or the voltage of the bus signal input at the input port 212 is $V_1$, then the FET 227 is turned off and the FET 228 is turned on, and thus the voltage at a node 252 is driven low. The gate voltage of the FET 223 is driven low so as to turn on the FET 223. As such, the voltage at a node 256 at the drain of the FET 223 is driven high and the voltage at the gate of the FET 284 is driven low by the inverter gate 294 so as to turn off the FET 284. The FET 284 is coupled to the resistor 264 to output the bus signal at the node 214 and the voltage at the node 214 is in a high state (the voltage is $V_3$).

On the other hand, when the bus signal input from the input port 212 is in a low state or the voltage of the bus signal input at the input port 212 is $V_0$, then the FET 228 is turned off and the FET 227 is turned on, and thus the voltage at a node 256 is driven low. Then, the voltage at the gate of the FET 284 is driven high so as to turn on the FET 284. The FET 284 is coupled to the resistor 264 to output the bus signal at the node 214 and the voltage at the node 214 is in a low state (the voltage is $V_2$).

In one embodiment, the FETs 225 and 226 can be incorporated to decrease the full swing of the voltage at the nodes 256 and 252, respectively. Thus, the voltage at the nodes 256 and 252 has the full swing from $V_3$ to $V_2$. Consequently, the power consumption can be decreased, and the bus signal speed can be increased.

Therefore, the bus signal can be transmitted through the bus block 220 from the input port 212 to the node 214. In a similar manner, the bus signal is transmitted through the bus block 230 from the node 214 to the node 216, and then transmitted through the bus block 240 and output at the output port 218. In other words, the bus signal is translated from a low voltage level (VDD=$V_1$, GND=$V_0$) to a high voltage level (VDD=$V_7$, GND=$V_6$). Thus, when the bus signal input at the input port 212 is in a high state, the output bus signal at the output port 218 is in a high state, OUT=1. When the bus signal input at the input port 212 is in a low state, the output bus signal at the output port 218 is in a low state, OUT=0.

Figure 3:
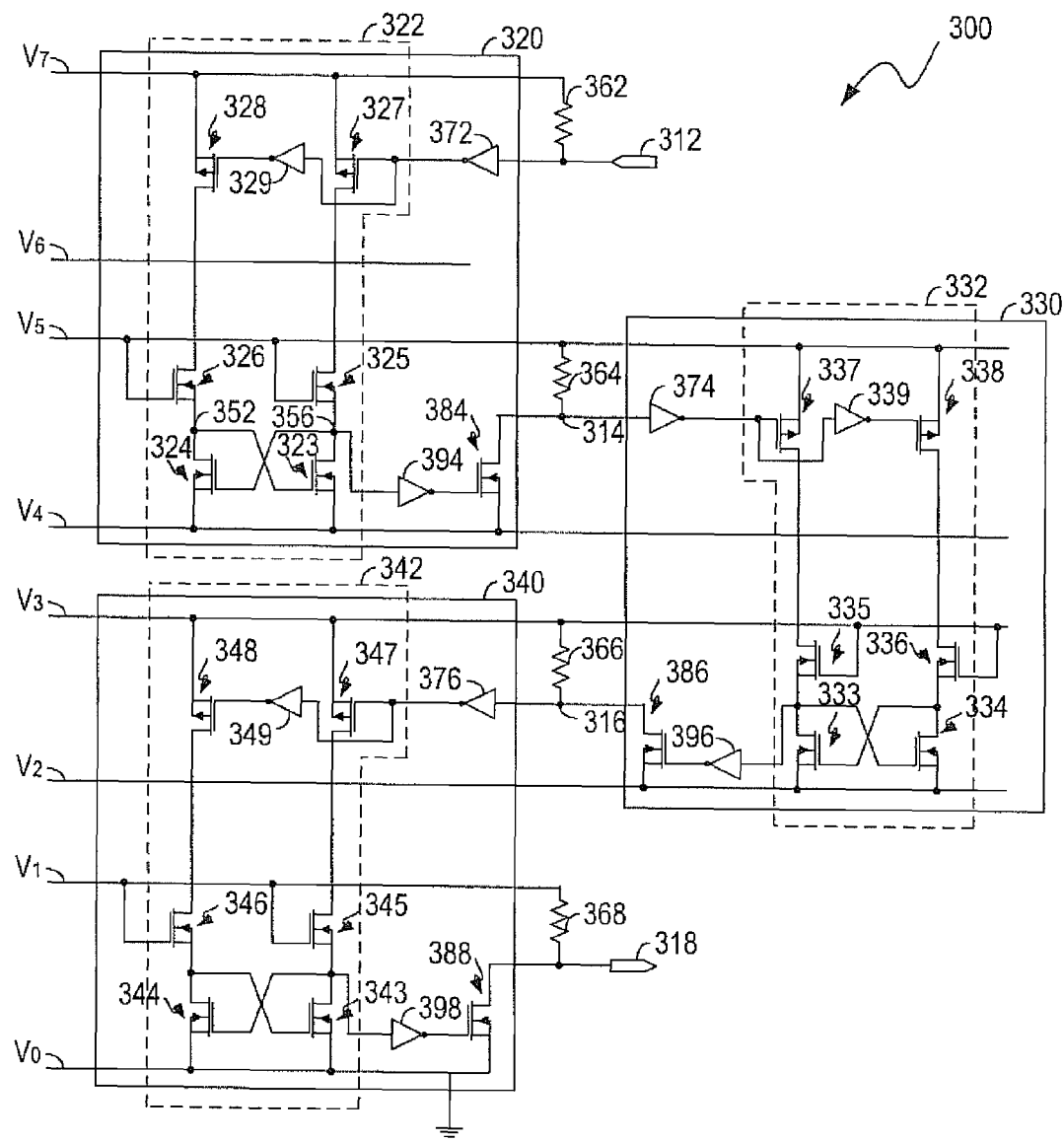
FIG. 3 shows a vertical bus circuit according to one embodiment of the present invention.

FIG. 3 shows a vertical bus circuit 300 according to one embodiment of the present invention. The vertical bus circuit 300 includes three bus blocks 320, 330, and 340 and multiple resistors 362, 364, 366 and 368. As shown in FIG. 3, the bus blocks 320, 330, and 340 are similar to each other. Although three bus blocks are shown in FIG. 3, the present invention is not so limited.

The bus blocks 320, 330, and 340 utilize different voltages. Taking the bus block 320 as an example, a bus signal is input into an input port 312 of the bus block 320 and transmitted to the bus block 330. At the input port 312 of the bus block 320, the low level voltage is $V_6$ and the high level voltage is $V_7$. When the bus signal is transmitted to the bus block 330 at a node 314, the low level voltage is $V_4$ and the high level voltage is $V_5$. Similarly, the bus signal can be transmitted from the bus block 330 to the bus block 340.

The bus blocks 320, 330, and 340 transmit a bus signal in the downward direction (considering the orientation of FIG. 3). For example, in the vertical bus circuit 300, the bus block 320 is a top bus block and the bus block 340 is a bottom bus block. A bus signal is input into an input port 312 of the bus block 320, and the bus signal is transmitted to the bus block 340 and output from an output port 318 of the bus block 340.

The bus block 320 includes a downward signal path 322, inverter gates 372 and 394, and a FET 384, in one embodiment. The downward signal path 322 includes FETs 323, 324, 325, 326, 327, and 328, and an inverter gate 329, in one embodiment. The bus block 330 includes a downward signal path 332, inverter gates 374 and 396, and a FET 386. The downward signal path 332 includes FETs 333, 334, 335, 336, 337, and 338, and an inverter gate 339. The bus block 340 includes a downward signal path 342, inverter gates 376 and 398, and a FET 388. The downward signal path 342 includes FETs 343, 344, 345, 346, 347, and 348, and an inverter gate 349.

The downward signal paths 322, 332, and 342 in the bus blocks 320, 330, and 340 translate the bus signal from a high voltage level to a low voltage level. For example, the signal path 322 in the bus block 320 translates the bus signal from a high voltage level (VDD=$V_7$, GND=$V_6$) to a low voltage level (VDD=$V_5$, GND=$V_4$).

The inverter gate 394 and the FET 384 of the bus block 320, and the resistor 364 and the inverter gate 374 of the bus block 330, transmit the bus signal from the bus block 320 to the bus block 330, in one embodiment. Similarly, the inverter gate 396 and the FET 386 of the bus block 330, and the resistor 366 and the inverter gate 376 of the bus block 340, transmit the bus signal from the bus block 330 to the bus block 340, in one embodiment.

When the bus signal input at the input port 312 of the bus block 320 is in a high state, IN=1, or the voltage of the bus signal input at the input port 312 is $V_7$, then the FET 328 is turned off and the FET 327 is turned on, and thus the voltage at a node 356 is driven high. Then, the voltage at the gate of the FET 384 is driven low so as to turn off the FET 384. The FET 384 is coupled to the resistor 364 to output the bus signal at the node 314 and the voltage at the node 314 is in a high state (the voltage is $V_5$).

On the other hand, when the bus signal input at the input port 312 is in a low state, IN=0, or the voltage of the bus signal input at the input port 312 is $V_6$, then the FET 327 is turned off and the FET 328 is turned on, and thus the voltage at a node 352 is driven high. The gate voltage of the FET 323 is driven high so as to turn on the FET 323. As such, the voltage at a node 356 at the drain of the FET 323 is driven low and the voltage at the gate of the FET 384 is driven high by the inverter gate 394 so as to turn on the FET 384. The FET 384 is coupled to the resistor 364 to output the bus signal at the node 314 and the voltage at the node 314 is in a low state (the voltage is $V_4$).

In one embodiment, the FETs 325 and 326 can be incorporated to decrease the full swing of the voltage at the nodes 356 and 352, respectively. Thus, the voltage at the nodes 356 and 352 has the full swing from $V_5$ to $V_4$, respectively. Consequently, the power consumption can be decreased, and the bus signal speed can be increased.

Therefore, the bus signal can be transmitted through the bus block 320 from the input port 312 to the node 314. In a similar manner, the bus signal is then transmitted through the bus block 330 from the node 314 to the node 316, and then transmitted through the bus block 340 and output at the output port 318. Thus, when the bus signal input at the input port 312 is in a high state, the output bus signal at the output port 318 is in a high state, OUT=1. When the bus signal input at the input port 312 is in a low state, the output bus signal at the output port 318 is in a low state, OUT=0.

Figure 4:
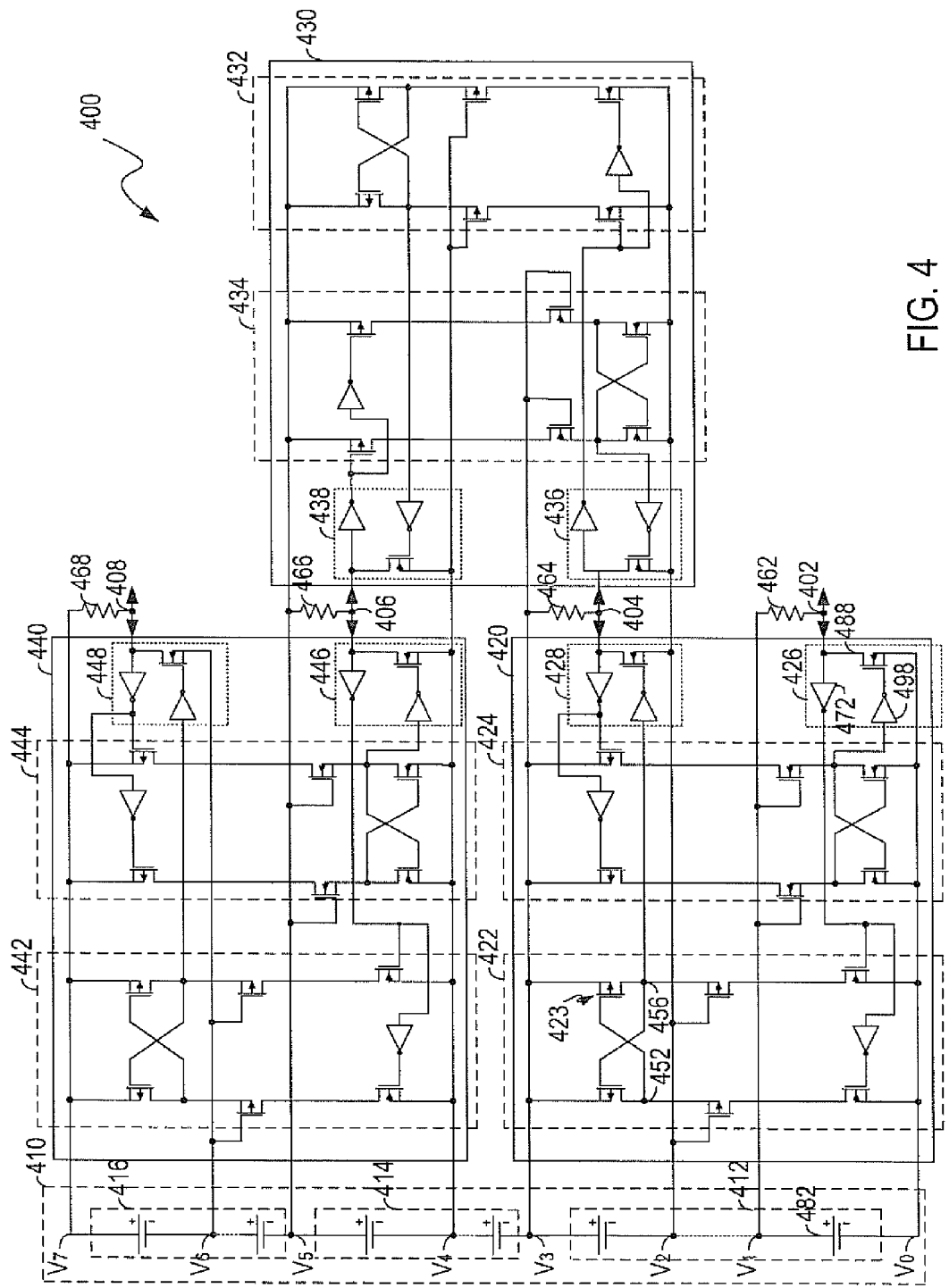
FIG. 4 shows a vertical bus circuit according to one embodiment of the present invention.

FIG. 4 shows a vertical bus circuit 400 according to one embodiment of the present invention. The modularized battery 410 includes three battery packs 412, 414, and 416. In the example of FIG. 4, the vertical bus circuit 400 is configured for a 1-wire bus and includes three bus blocks 420, 430, and 440 and a plurality of resistors 462, 464, 466, and 468. Each of the bus blocks 420, 430, and 440 is identical and can be formed as an integrated circuit (IC) chip, in one embodiment.

Although the vertical bus circuit 400 is coupled to the battery 410 and is used for enabling signal transmission in the battery management system, the present invention is not so limited. Although three bus blocks are shown in FIG. 4, the present invention is not so limited.

Each of the battery packs 412, 414 and 416 includes a plurality of cells coupled to each other in series. The modularized battery 410 provides eight voltages $V_0$, $V_1$, $V_2$, $V_3$, $V_4$, $V_5$, $V_6$, and $V_7$. In one embodiment, the voltage differences between $V_1$ and $V_0$, between $V_3$ and $V_2$, between $V_5$ and $V_4$, and between $V_7$ and $V_6$, are equal to each other. The voltage difference may be equal to the voltage of one cell in a battery pack or the voltage difference may be equal to the sum of the voltages of several cells in a battery pack.

In the example of FIG. 4, the bus block 420 includes a signal path and I/O devices 426 and 428. Similarly, the bus block 430 includes a signal path and I/O devices 436 and 438. The bus block 440 includes a signal path and I/O devices 446 and 448. In one embodiment, the signal path in the bus block 420 can include an upward signal path 422 and a downward signal path 424. Similarly, the signal path in the bus block 430 can include an upward signal path 432 and a downward signal path 434. The signal path in the bus block 440 can include an upward signal path 442 and a downward signal path 444.

In one embodiment, the upward signal paths 422, 432, and 442 are similar to the upward signal paths 222, 232, and 242 shown in FIG. 2. In one embodiment, the downward signal paths 424, 434, and 444 are similar to the downward signal paths 342, 332, and 322 shown in FIG. 3.

In another embodiment, the vertical bus circuit 400 can include bus blocks that each have two upward signal paths, two downward signal paths, and four I/O devices for a 2-wire bus.

Advantageously, the bus blocks 420, 430, and 440 share multiple common voltage levels. Furthermore, the multiple common voltage levels enable signal transmission between the bus blocks 420, 430, and 440. For example, the I/O devices 426 and 428 in the bus block 420 are powered by the voltage level (VDD=$V_1$, GND=$V_0$) and the voltage level (VDD=$V_3$, GND=$V_2$), respectively. The I/O devices 436 and 438 in the bus block 430 are powered by the voltage level (VDD=$V_3$, GND=$V_2$) and the voltage level (VDD=$V_5$, GND=$V_4$), respectively. Therefore, the bus blocks 420 and 430 share the voltage level (VDD=$V_3$, GND=$V_2$) and the voltage level enables signal transmission between the bus blocks 420 and 430.

In one embodiment, the voltage of one cell in the battery pack can be used as the common voltage level, or the sum of the voltages of several cells in the battery pack can be used as the common voltage level. In other words, at least one cell in the battery pack can be used as the common voltage level.

In the example of FIG. 4, the I/O device 426 includes the inverter gate 472, which is similar to the inverter gate 272 shown in FIG. 2, and the inverter gate 498 and the FET 488, which are respectively similar to the inverter gate 398 and the FET 388 shown in FIG. 3. The I/O device 428, the I/O device 436, the I/O device 438, the I/O device 446, and the I/O device 448 are similar to the I/O device 426, and so are not further described. Advantageously, the signal path in each bus block enables signal transmission between the two I/O devices in the bus block as described in FIG. 2 and FIG. 3 and so are not further described.

Nodes 402, 404, 406, and 408 serve as I/O ports of the bus blocks 420, 430 and 440. As described hereinbefore, the bus signal at each node can be transmitted in upward and forward directions. For example, the bus signal at the node 402 can be transmitted to the nodes 404, 406, and 408, and the bus signal can then be transmitted from the nodes 404, 406, and 408 and received at the node 402. Thus, each of the bus blocks 420, 430, and 440 uses two I/O ports (e.g., the nodes 402 and 404 of the bus block 420) for a 1-wire bus. In another embodiment, the bus blocks use four I/O ports for 2-wire bus. Therefore, the pin counts of the IC chips of the bus blocks can be reduced.

The I/O devices are open-drain, and thus the I/O devices are relatively flexible and can be configured as Inter-Integrated Circuit (I.sup.2C), Serial Peripheral Interface (SPI), or some other type of bus. Furthermore, the vertical bus circuit 400 does not need to consume power in the static state. The bus signal transmitted in each bus block of the vertical bus circuit 400 is a differential signal; for example, in level shifter 422, if the FET 423 is turned on or turned off is determined by the voltage difference between the voltage at the node 452 and the voltage at the node 456. Similar to the combined circuit of the FETs 223, 224, 225, 226, 227 and 228 of the upward signal path 222 in FIG. 2, the combined circuit of the FETs in the level shifter 422 can be referred to as a differential circuit. Thus, relatively high bus signal speed and relatively better tolerance can be obtained.

As noted above, the voltage of one cell or the sum of the voltages of several cells in each of the battery packs 412, 414, and 416 is provided for enabling bus signal transmission through the bus blocks, and thus the bus signal has full swing over the range of voltage of one cell or several cells. Advantageously, when the sum of the voltages of several cells is provided for enabling bus signal transmission through the bus blocks, the full swing of the bus signal can be increased, and thus, better tolerance of the bus signal can be obtained.

The nodes 402, 404, 406, and 408 will not suffer overvoltage transients since the operating voltage of each node is within its I/O device's power supply voltage range; as shown in FIG. 4, the power supply voltage range is the voltage of one cell. For example, the operating voltage of the node 402 is within the voltage of a cell 482 in the battery pack 412, which is from $V_0$ to $V_1$.

Figure 5:
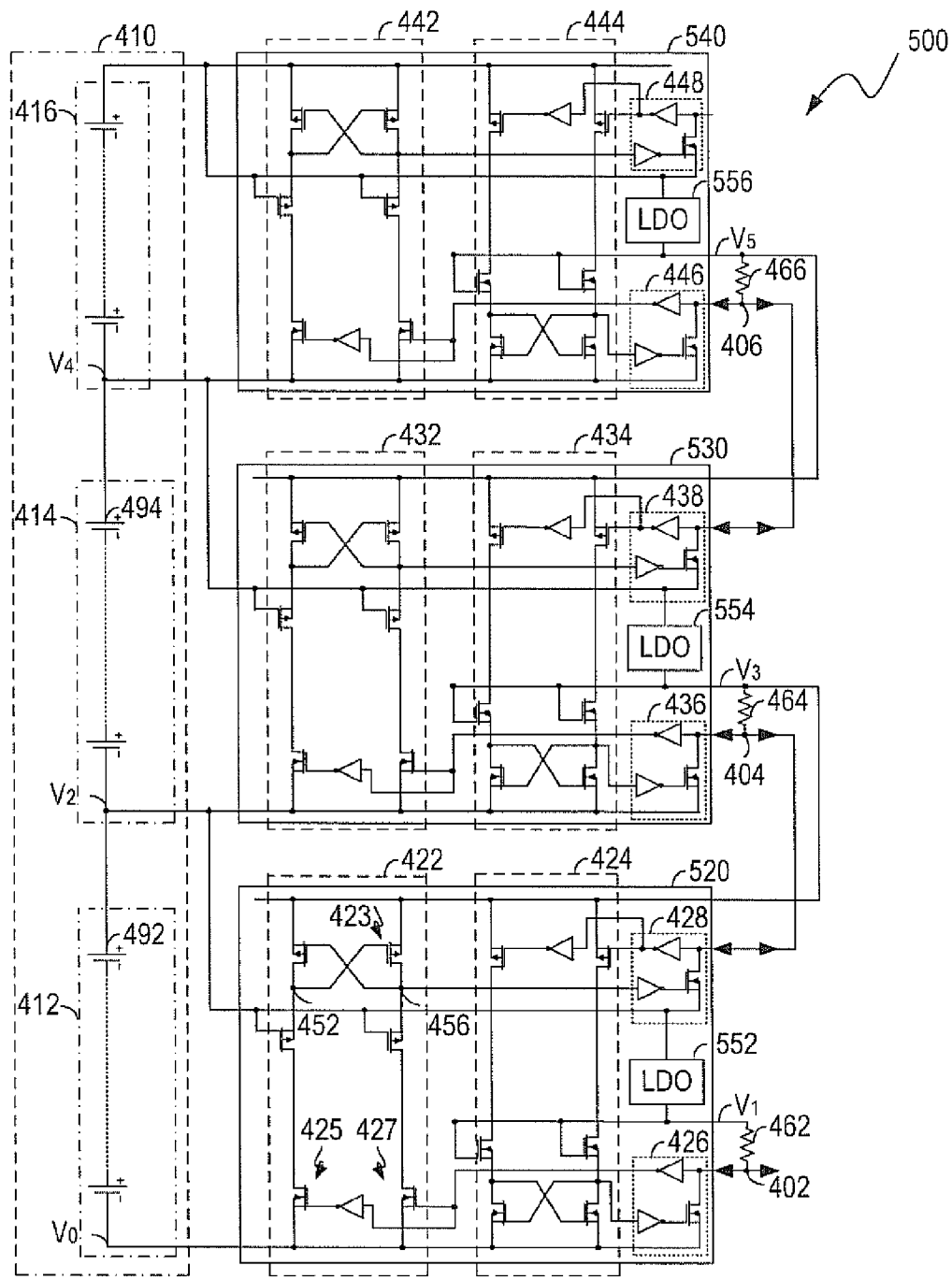
FIG. 5 shows a vertical bus circuit according to another embodiment of the present invention.

FIG. 5 shows a vertical bus circuit 500 according to another embodiment of the present invention. Elements labeled the same as in FIG. 4 have similar functions. The battery 410 includes three battery packs 412, 414 and 416. In the example of FIG. 5, the vertical bus circuit 400 is configured for a 1-wire bus and includes three bus blocks 420, 430, and 440 and multiple resistors 462, 464, and 466. Each of the bus blocks 420, 430, and 440 is identical and can be formed as an integrated circuit (IC) chip, in one embodiment.

Although the vertical bus circuit 500 is coupled to the battery 410 and is used for enabling signal transmission in the battery management system, the present invention is not so limited. Although three bus blocks are shown in FIG. 5, the present invention is not so limited.

In the example of FIG. 5, the bus block 520 includes a signal path, a voltage regulator such as a low drop-out regulator (LDO) 552, and I/O devices 426 and 428. Similarly, the bus block 530 includes a signal path, a voltage regulator 554, and I/O device 436 and 438. The bus block 540 includes a signal path, a voltage regulator 556, and I/O device 446 and 448. In one embodiment, the signal path in the bus block 520 can include an upward signal path 422 and a downward signal path 424. Similarly, the signal path in the bus block 530 can include an upward signal path 432 and a downward signal path 434. The signal path in the bus block 540 can include an upward signal path 442 and a downward signal path 444.

In another embodiment, the vertical bus circuit 400 can include bus blocks each having two upward signal paths, two downward signal paths and four I/O devices for a 2-wire bus.

Advantageously, the bus blocks 520, 530, and 540 share multiple common voltage levels. Furthermore, the multiple common voltage levels enable signal transmission between the bus blocks 520, 530, and 540. For example, the I/O devices 426 and 428 in the bus block 520 are powered by the voltage level (VDD=$V_1$, GND=$V_0$) and the voltage level (VDD=$V_3$, GND=$V_2$), respectively. The I/O devices 436 and 438 in the bus block 530 are powered by the voltage level (VDD=$V_3$, GND=$V_2$) and the voltage level (VDD=$V_5$, GND=$V_4$), respectively. Therefore, the bus blocks 520 and 530 share the voltage level (VDD=$V_3$, GND=$V_2$) and the voltage level enables signal transmission between the bus blocks 520 and 530.

In one embodiment, each common voltage level can be provided by the voltage at the positive terminal of one cell in each battery pack and the output voltage of the voltage regulator. For example, voltage $V_4$ is the voltage at the positive terminal of a cell 494 in the battery pack 414, and voltage $V_2$ is the voltage at the positive terminal of a cell 492 in the battery pack 412. The voltage $V_4$ is supplied to the voltage regulator 554 in the bus block 430 and an output voltage $V_3$ is output by the voltage regulator 554. As such, the output voltage $V_3$ and the voltage $V_2$ are provided for enabling the bus signal transmission between the bus blocks 530 and 520.

Advantageously, the signal path in each bus block enables signal transmission between the two I/O devices in the bus block as described in FIG. 2 and FIG. 3 and so are not further described.

The output voltages of the LDOs 552, 554 and 556, which are relatively stable, provide power supplies for enabling bus signal transmission in the vertical bus circuit 500. Thus, the vertical bus circuit 500 is not influenced by the cell voltage fluctuation during rapid charging or discharging, and thus is relatively reliable.

The maximum number of the cells in each of the battery pack 412, 414 and 416 is determined by the maximum allowed $V_{ds}$ of the FET in the bus block coupled to the battery pack and the output voltage of the voltage regulator in the bus block on top of this bus block. For example, as shown in FIG. 5, the maximum allowed $V_{ds}$ of FET 425/427 in the bus block 520 is equal to the sum of the voltage difference between $V_3$ and $V_2$ and the voltage provided by the battery pack 412, wherein the voltage difference between $V_3$ and $V_2$ is the output voltage of the voltage regulator 554 in the bus block 530. Thus, the maximum number of the cells in the battery pack 412 can be given in equation (1) as follows:

$$N = (V_{ds} - V_{LDO})/V_{cell}, \quad (1)$$

where N is the maximum number of the cells in the battery pack 412, $V_{ds}$ is the maximum allowed $V_{ds}$ of FET 425/427, $V_{LDO}$ is the output voltage of the voltage regulator 554 in the bus block 530, and $V_{cell}$ is a cell voltage.

Figure 6:
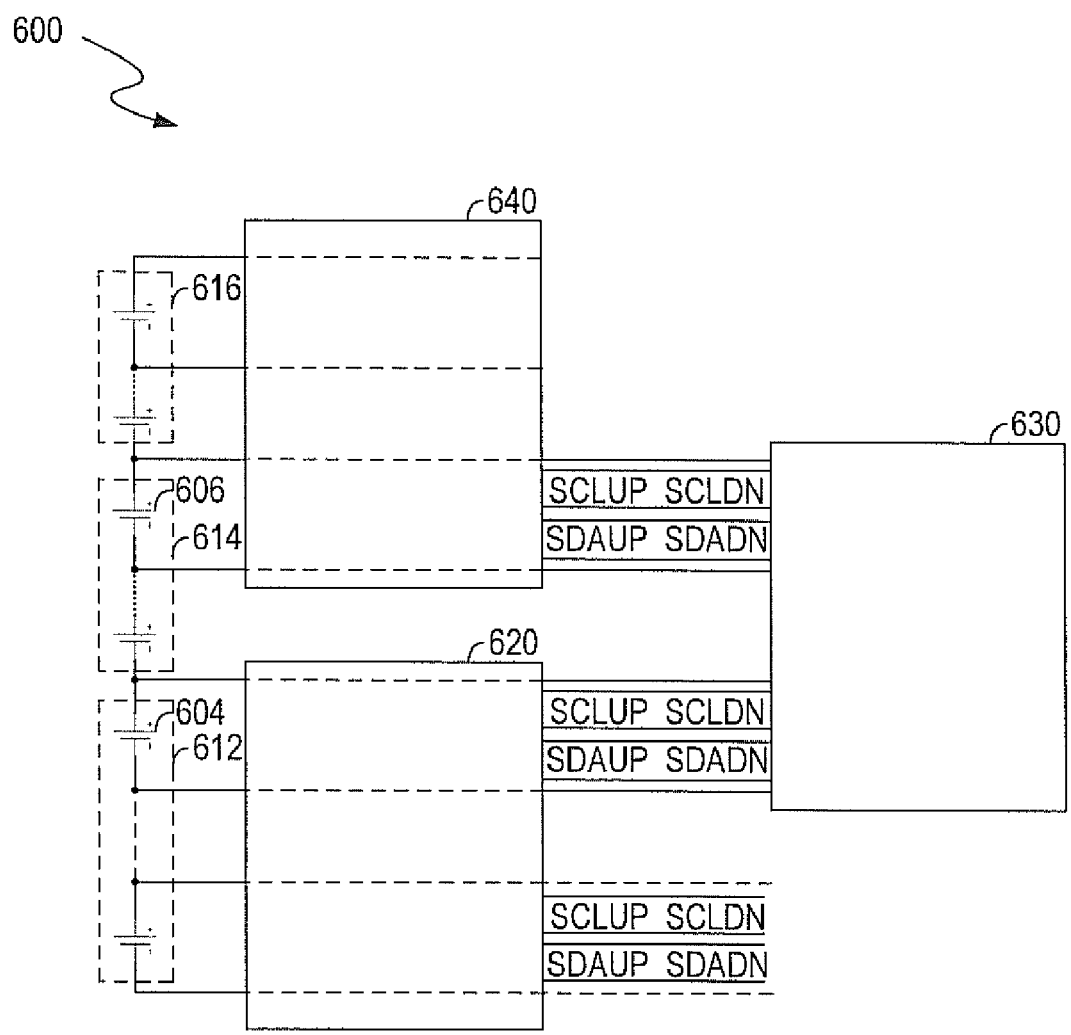
FIG. 6 shows a vertical bus topology for a battery management system according to one embodiment of the present invention.

FIG. 6 shows a vertical bus topology 600 for a battery management system according to one embodiment of the present invention. The vertical bus topology 600 is used for an I²C bus application. The vertical bus topology 600 includes bus blocks 620, 630, and 640. The bus blocks 620, 630, and 640 are coupled to battery packs 612, 614, and 616. Thus, the bus blocks 620, 630, and 640 use different voltages.

Advantageously, the bus blocks 620, 630, and 640 share multiple common voltage levels. In one embodiment, the voltage of one cell in each of the battery packs 612, 614, and 616 can be used as the common voltage level. For example, the voltage of a cell 604 in the battery pack 612 is used as a common voltage level shared by the bus blocks 620 and 630. The voltage of a cell 606 in the battery pack 614 is used as a common voltage level shared by the bus blocks 630 and 640. The common voltage levels enable signal transmission between the bus blocks 620, 630, and 640; for example, the voltage of the cell 604 enables signal transmission between the bus blocks 620 and 630.

As described hereinbefore, each of the bus blocks 620, 630 and 640 are able to communicate with the other bus blocks using, for example, the I²C bus protocol.

Although three bus blocks are shown in FIG. 6, the present invention is not so limited.

Alternatively, the sum of the voltages of two or more cells in each of the battery packs 612, 614, and 616 can used as the common voltage level for enabling bus signal transmission for relatively better bus signal swing and relatively better tolerance, in one embodiment.

Figure 7:
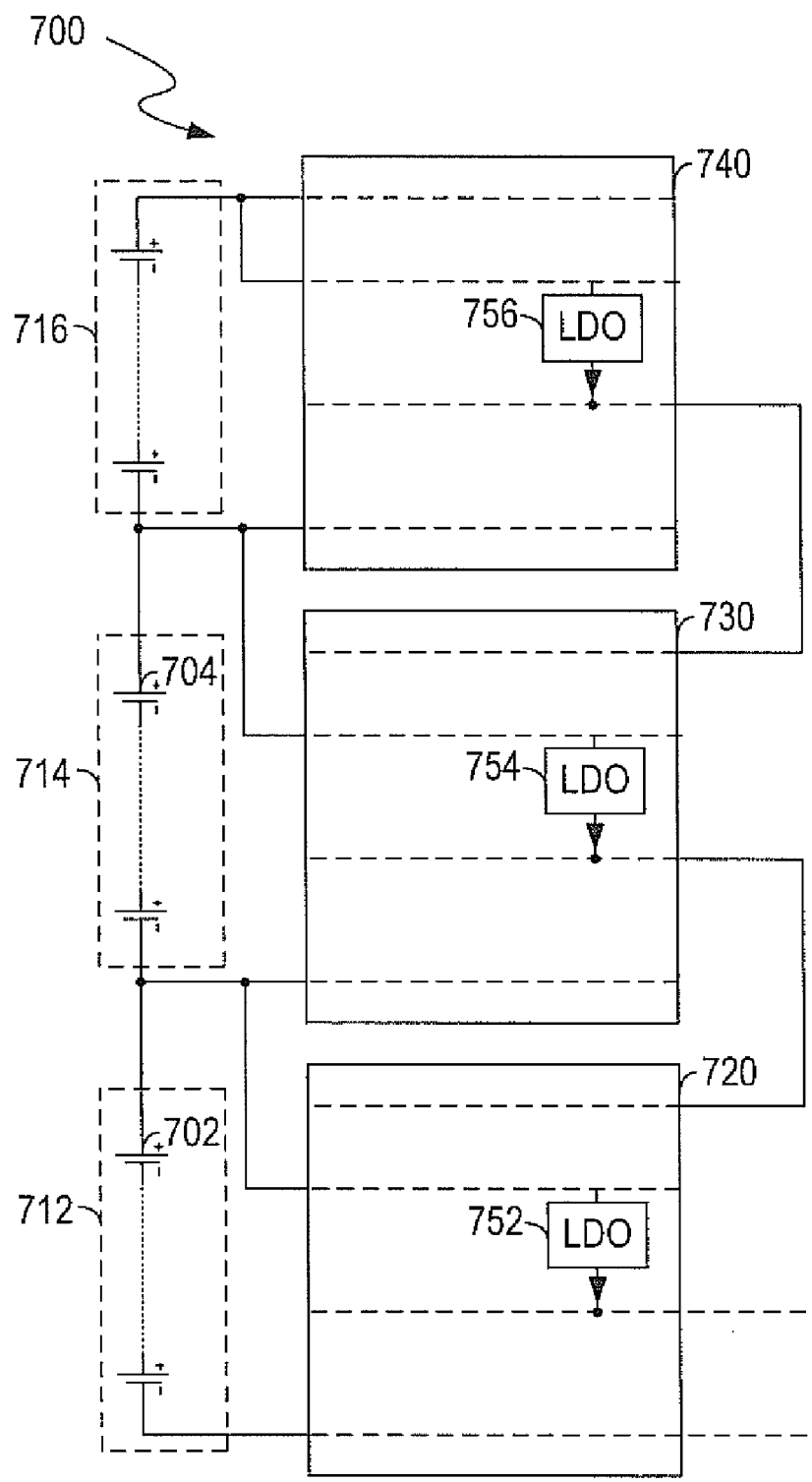
FIG. 7 shows a vertical bus topology for a battery management system according to another embodiment of the present invention.

FIG. 7 shows a vertical bus topology 700 for a battery management system according to another embodiment of the present invention. The vertical bus topology 700 is used for an I²C bus application. The vertical bus topology 700 includes bus blocks 720, 730, and 740. The bus blocks 720, 730, and 740 are coupled to battery packs 712, 714, and 716. In the example of FIG. 7, the bus block 720, 730, and 740 include voltage regulators 752, 754, and 756, respectively. In one embodiment, the voltage regulator can be a LDO.

Although three bus blocks are shown in FIG. 5, the present invention is not so limited.

Advantageously, the bus blocks 720, 730 and 740 share multiple common voltage levels. Furthermore, the common voltage levels enable signal transmission between the bus blocks 720, 730, and 740. Each of the common voltage levels can be provided by the voltage at the positive terminal of one cell in each of the battery packs 712, 714, and 716 and the output voltage of the voltage regulator, in one embodiment. For example, the voltage at the positive terminal of a cell 704 in the battery pack 714 is supplied to the voltage regulator 754, and an output voltage is output by the voltage regulator 754. Thus, the output voltage output by the voltage regulator 754 and the voltage at the positive terminal of a cell 702 in the battery pack 712 provides the common voltage level shared by the bus blocks 720 and 730. As described hereinbefore, each of the bus blocks 720, 730 and 740 are able to communicate with the other bus blocks using, for example, the I²C bus protocol.

Figure 8:
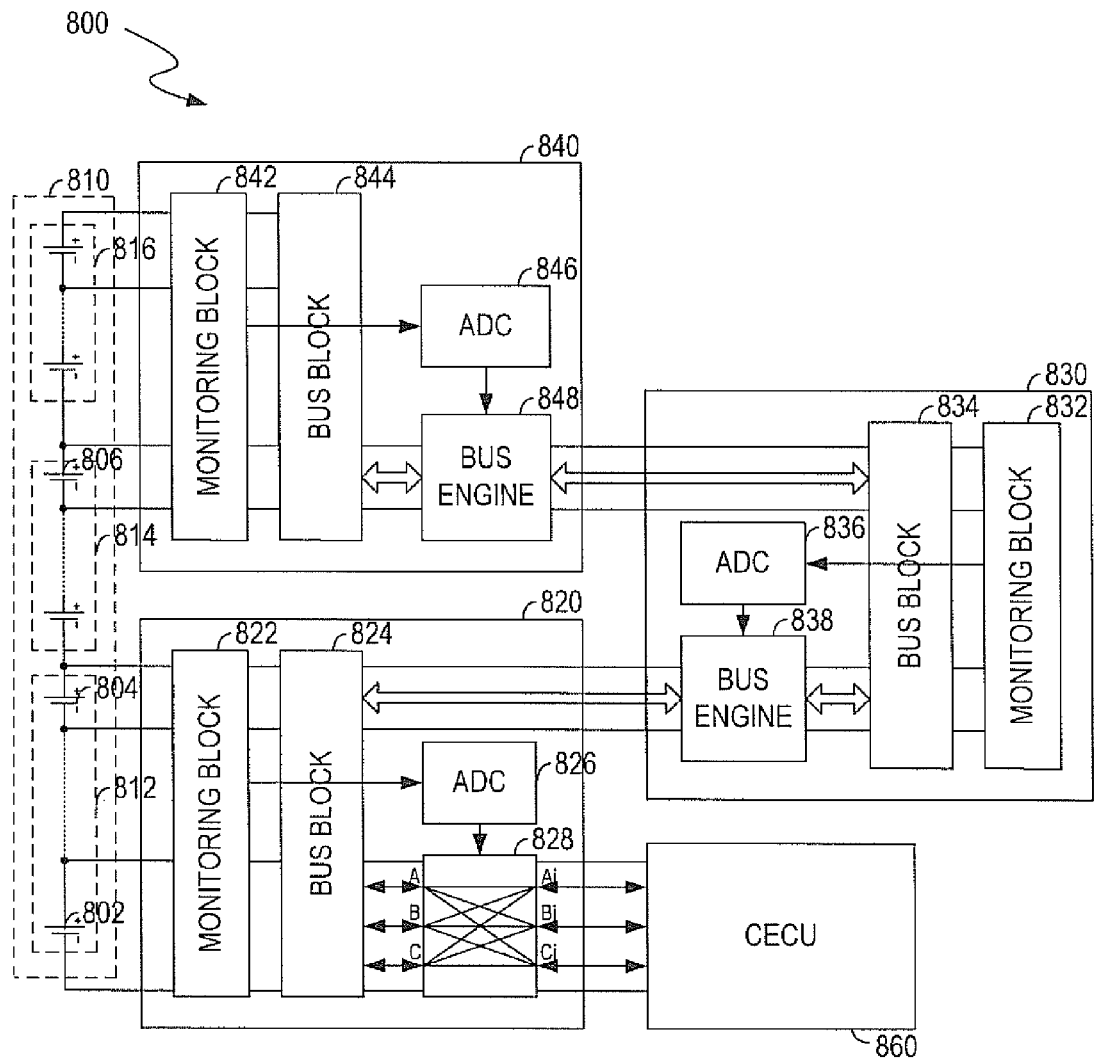
FIG. 8 shows a battery management system according to one embodiment of the present invention.

FIG. 8 shows a battery management system 800 according to one embodiment of the present invention. The battery management system 800 includes a battery 810, AFE devices 820, 830, and 840, and a central electronic control unit (CECU) 860. The battery 810 includes battery packs 812, 814, and 816. The AFE devices 820, 830, and 840 are coupled to battery packs 812, 814, and 816, respectively. In this instance, the AFE devices 820, 830, and 840 use voltages provided by battery packs 812, 814, and 816, respectively. Thus, the AFE devices 820, 830, and 840 use different voltages.

Although three AFE devices are shown in FIG. 8, the present invention is not so limited.

The CECU 860 is coupled to the AFE device 820 which is a bottom AFE device in the system 800, in one embodiment. Advantageously, the CECU 860 can communicate with a destination AFE device via the CECU 860, the AFE device 820, a group of the AFE devices 820, 830, and 840, and the destination device. The group of the AFE devices 820, 830, and 840 use voltages that are between a voltage used by the AFE device 820 and a voltage used by the destination AFE device. For example, a signal can be transmitted from the CECU 860 to the AFE device 840 via the CECU 860, the AFE device 820, the AFE device 830, and the AFE device 840. The voltage used by the AFE device 830 is between the voltage used by the AFE device 820 and the voltage used by the AFE device 840.

The common voltage levels shared by the AFE devices 820, 830, and 840 enable bus signal transmission through the AFE devices 820, 830, and 840. In one embodiment, the voltage of one cell in each of the battery packs 812, 814, and 816 can be used as the common voltage level. For example, the voltage of a cell 804 in the battery pack 812 is used as the common voltage level and enables signal transmission between the AFE devices 820 and 830.

Alternatively, the voltages of two or more cells in each of the battery packs 812, 814 and 816 can be provided for enabling bus signal transmission for relatively better bus signal swing and relatively better tolerance, in one embodiment.

In one embodiment, the AFE devices 820, 830, and 840 are identical, and can be formed as identical integrated circuit (IC) chips. In the example of FIG. 8, the AFE device 820 includes a monitoring block 822, a bus block 824, an analog-to-digital converter (ADC) 826, a bus engine 828, and I/O devices (not shown), in one embodiment. Similarly, the AFE device 830 includes a monitoring block 832, a bus block 834, an ADC 836, a bus engine 838, and I/O devices (not shown). The AFE device 840 includes a monitoring block 842, a bus block 844, an ADC 846, a bus engine 848, and I/O devices (not shown). In one embodiment, each of the bus blocks 824, 834 and 844 includes an upward signal path (e.g., the upward signal path 422 shown in FIG. 4) and a downward signal path (e.g., the downward signal path 424 shown in FIG. 4) to transmit bus signals in the upward direction and downward direction, respectively.

The AFE devices 820, 830, and 840 can access the status of the cells in the corresponding battery pack. Furthermore, the AFE devices 820, 830, and 840 can communicate with the CECU 860 through a vertical bus. In one embodiment, the vertical bus can include the bus blocks 824, 834, and 844, the bus engines 828, 838, and 848, and the I/O devices. The I/O devices in each AFE device are powered by different voltage levels, respectively. The bus block in each AFE device can transmit signals between the I/O devices.

Taking AFE device 820 as an example, the monitoring block 822 in the AFE device 820 can select one of the cells in the battery pack 812 and provide the status of the cell to the ADC 826, in one embodiment. The ADC 826 in the AFE device 820 converts the status of the cell, which is an analog signal, into a digital signal and transmits the digital signal to the bus engine 828. The bus engine 828 is a controller in the AFE device 820 and can communicate with the CECU 860.

Each of the AFE devices 820, 830, and 840 can work in a master mode or a slave mode to communicate with the CECU 860. When an AFE device works in the master mode, the bus engine in the AFE device can issue a signal for communication with the CECU 860. For example, when the AFE device 840 works in the master mode, the bus engine 848 issues an alert signal to the CECU 860. The alert signal is transmitted to the bus engines 838 and 828 by the vertical bus and then is transmitted to the CECU 860. When an AFE device works in the slave mode, the CECU 860 issues a signal for communication with the bus engine in the AFE device. For example, when the AFE device 840 works in the slave mode, signals from the CECU 860 are transmitted to the bus engine 828 in the AFE device 820 and then are transmitted to the bus engine 848 in the AFE device 840 by the vertical bus.

When a 2-wire bus protocol is used in the system 800, each bus engine uses three bus lines for relatively better error tolerance. As shown in FIG. 8, the bus engine 828 has three ports A, B and C on the left side of the bus engine 828, and three ports $A_i$, $B_i$ and $C_i$ on the right side of the bus engine 828. For example, if the ports A, B, $A_i$ and $B_i$ are rendered as default ports to transmit the bus signals and if the port B is erroneous, then the port C can be used as a backup port to transmit the bus signal. Thus, relatively better error tolerance can be obtained. When a 1-wire bus protocol is used in the system 800, each bus engine uses two bus lines for relatively better error tolerance, in one embodiment. In other words, each bus engine can use a backup line to replace the default line if the default line becomes unavailable for some reason.

The cells 802, 804, and 806 provide reference voltages for on-line diagnosis (identification of a problem) and calibration, in one embodiment. In other words, the common voltage levels shared by the AFE devices 820, 830, and 840 can be used for the on-line diagnosis and calibration. More specifically, the CECU 860 includes an accurate ADC (not shown in FIG. 8) for on-line diagnosis and calibration, in one embodiment. As used herein, the term "accurate ADC" or "accurate converter" means that the ADC/converter converts a voltage to a value and a difference between that value and a genuine value of the voltage is less than a threshold value. The voltage of the cell 802 is converted by the accurate ADC in the CECU 860 and the ADC 826 in the AFE device 820. If the two converted results are not equal, then the ADC 826 will be calibrated. Similarly, the voltage of the cell 804 is converted by the calibrated ADC 826 and the ADC 836 in the AFE device 830 so as to diagnose and calibrate the ADC 836. As a result, all the ADCs in the AFE devices can be diagnosed and calibrated. Therefore, it's relatively easy to do on-line diagnosis and calibration in the system 800.

An external accurate reference voltage (not shown in FIG. 8) can be used as the reference voltages as described above for on-line diagnosis and calibration of the ADCs.

Figure 9:
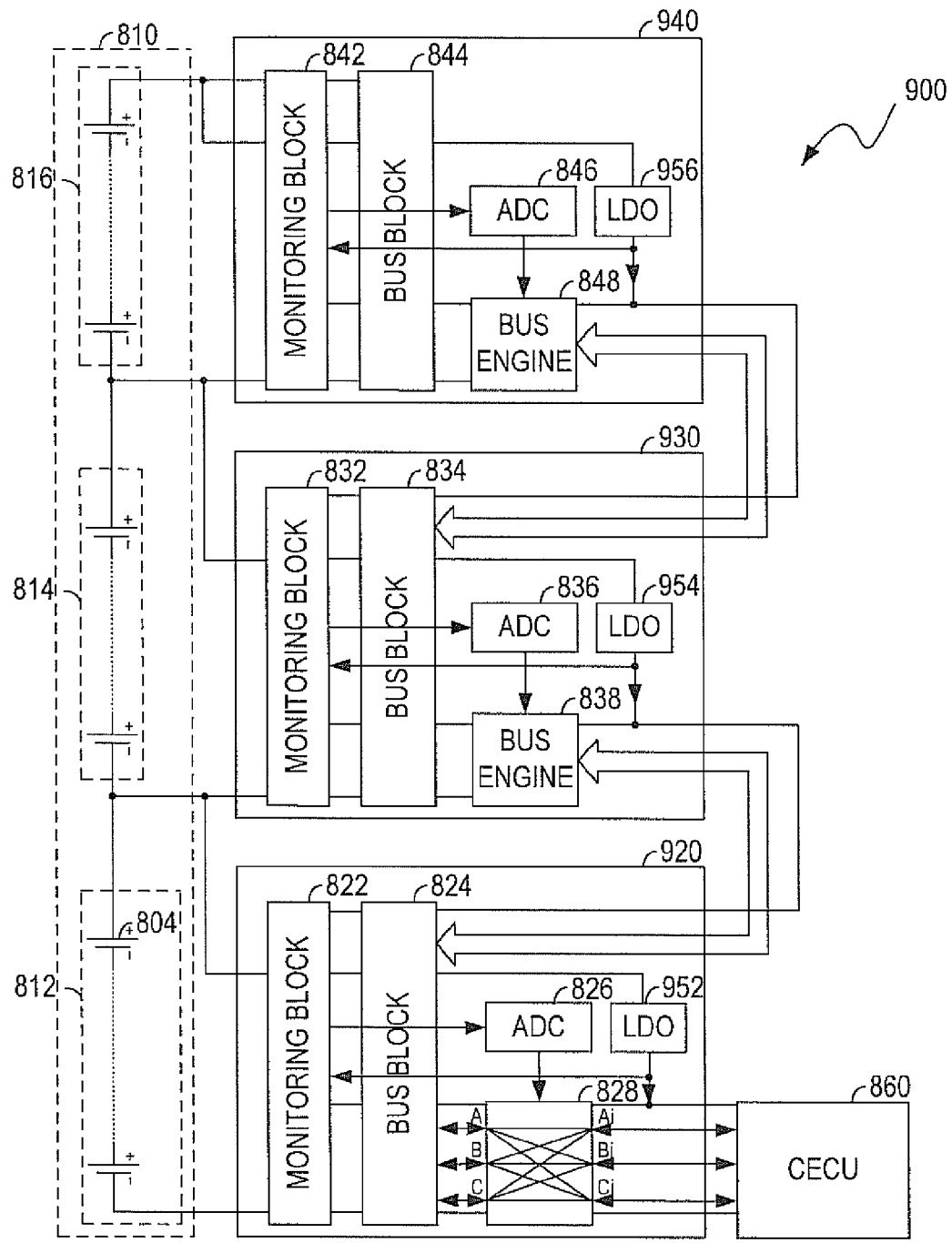
FIG. 9 shows a battery management system according to another embodiment of the present invention.

FIG. 9 shows a battery management system 900 according to another embodiment of the present invention. Elements labeled the same as in FIG. 8 have similar functions. The battery management system 900 includes a battery 810, AFE devices 920, 930, and 940, and a CECU 860. The battery 810 includes battery packs 812, 814, and 816. The AFE devices 920, 930 and 940 coupled to the battery 810 can access the status of cells in the battery 810. The CECU 860 coupled to the AFE device 920 can communicate with a destination AFE device of the AFE devices 920, 930, and 940.

Although three bus blocks are shown in FIG. 9, the present invention is not so limited.

In one embodiment, the AFE devices 920, 930 and 940 are identical, and can be formed as identical integrated circuit (IC) chips. The AFE device 920 includes a monitoring block 822, a bus block 824, an ADC 826, a bus engine 828, a voltage regulator 952 and I/O devices (not shown), in one embodiment. Similarly, the AFE device 930 includes a monitoring block 832, a bus block 834, an ADC 836, a bus engine 838, a voltage regulator 954 and I/O devices (not shown). The AFE device 940 includes a monitoring block 842, a bus block 844, an ADC 846, a bus engine 848, a voltage regulator 956 and I/O devices (not shown). In one embodiment, the voltage regulator 952, 954, and 956 can be a LDO.

The voltage at the positive terminal of one cell in each of the battery packs 812, 814, and 816 and the output voltage of the voltage regulators 952, 954, and 956 provide the common voltage level to enable signal transmission through the AFE devices 920, 930, and 940, in one embodiment. For example, the voltage at the positive terminal of the cell 804 in the battery pack 812 and the output voltage of the voltage regulator 954 in the bus block 930 provide the common voltage level to enable signal transmission between the AFE devices 920 and 930.

The voltage regulator 952, 954, and 956 provide reference voltages for on-line diagnosis and calibration, in one embodiment. The CECU 860 further includes an accurate ADC (not shown) for on-line diagnosis and calibration, in one embodiment. In this instance, the output voltage of each voltage regulator is converted by the accurate ADC and the ADCs in the AFE devices 920, 930, and 940 and is not further described.

An external accurate reference voltage (not shown) can be used as the reference voltages as described above for on-line diagnosis and calibration of the ADCs.

Figure 10:
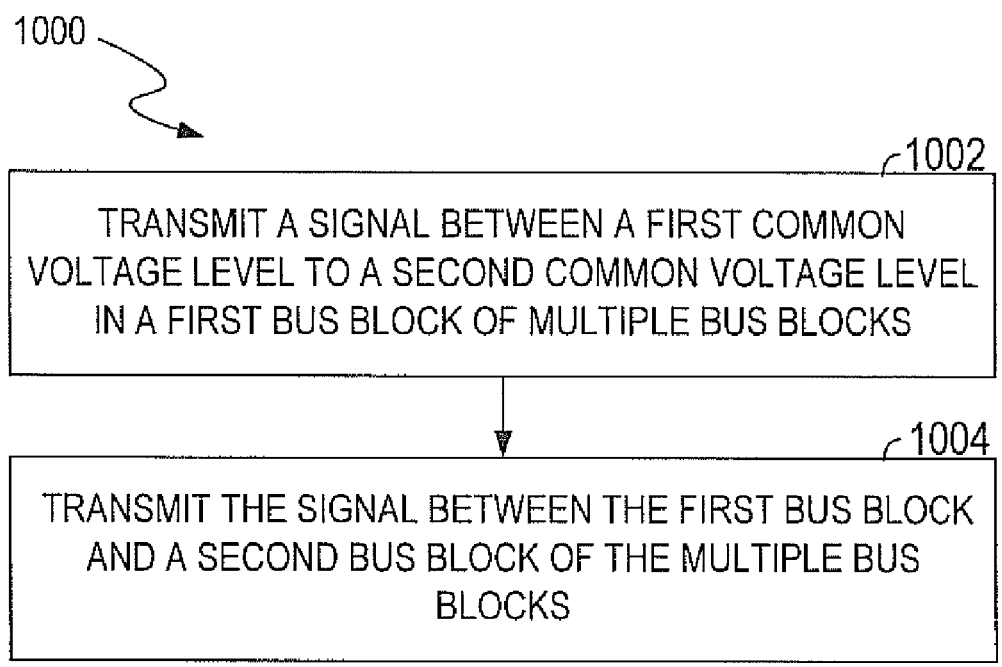
FIG. 10 shows a flowchart of a method for enabling signal transmission according to one embodiment of the present invention.

FIG. 10 shows a flowchart of a method for enabling signal transmission according to one embodiment of the present invention. FIG. 10 is described in combination with FIG. 4.

At 1002, a signal can be transmitted between the voltage level (VDD=$V_1$, GND=$V_0$) and the voltage level (VDD=$V_3$, GND=$V_2$). The I/O device 426 in the bus block 420 is powered by the voltage level (VDD=$V_1$, GND=$V_0$). The I/O device 428 in the bus block 420 is powered by the voltage level (VDD=$V_3$, GND=$V_2$). The upward signal path 422 can transmit the signal from the I/O device 426 to the I/O device 428. The downward signal path 424 can transmit the signal from the I/O device 428 to the I/O device 426.

At 1004, the signal can be transmitted between the bus block 420 and the bus block 430. A common voltage level (VDD=$V_3$, GND=$V_2$) shared by the bus blocks 420 and 430 enables signal transmission between them.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A vertical bus circuit for reduced power consumption management of a battery comprising a rechargeable multi-cell battery pack, comprising:
a plurality of bus blocks coupled to a plurality of cells in said battery and operable for transmitting signals indicating statuses of said cells between said bus blocks, wherein said bus blocks share a plurality of common voltage levels, wherein each of said bus blocks comprises a signal path, a first input/output (I/O) device, and a second I/O device, wherein said first and second input/output (I/O) devices are powered by a first common voltage level and a second common voltage level of said common voltage levels respectively, wherein said signal path enables signal transmission between said first and second I/O devices, wherein said common voltage levels enable said signal transmission between said bus blocks, and wherein said signal path comprises a differential circuit operable for transmitting said signals using a voltage difference between a first voltage and a second voltage, wherein said first and second voltages are determined by said common voltage levels.

2. The circuit of claim 1, wherein said signal path comprises an upward signal path and a downward signal path and wherein said upward signal path and said down signal path share said first and second I/O devices.

3. The circuit of claim 1, wherein each of said bus blocks is coupled to a group of cells in said battery, and wherein the voltage of at least one cell in said group of cells is used as each of said common voltage levels.

4. The circuit of claim 1, wherein each of said bus blocks is coupled to a group of cells in said battery, wherein each of said bus blocks further comprises a voltage regulator, and wherein said common voltage levels are provided by the voltage at the positive terminal of one cell in said group of cells and the output voltage of said voltage regulator.

5. A battery management system for reduced power consumption management of a battery comprising a rechargeable multi-cell battery pack, comprising:
a plurality of devices coupled to said battery having a plurality of cells, said plurality of devices operable for assessing the status of said cells, wherein each device of said plurality of devices is coupled to a group of cells of said plurality of cells, and wherein said plurality of devices use different voltages; and
a control unit coupled to a first device of said plurality of devices and operable for communicating with a destination device of said plurality of devices via said control unit, said first device, a group of devices of said plurality of devices, and said destination device, wherein said group of devices uses voltages that are between a voltage used by said first device and a voltage used by said destination device, wherein said each device of said plurality of devices comprises a differential circuit operable for transmitting a signal indicative of said status of said cells using a voltage difference between a first voltage and a second voltage, and wherein said first and second voltages are determined by said different voltages.

6. The system of claim 5, wherein said plurality of devices are powered by said plurality of cells, and wherein said first device comprises a device powered by a cell that has the lowest voltage level among said plurality of cells.

7. The system of claim 5, wherein said plurality of devices share a plurality of common voltage levels, and wherein each of said common voltage levels is configured to enable communication between a first device of said plurality of devices and a second device of said plurality of devices that share said each of said common voltage levels.

8. The system of claim 7, wherein said each device of said plurality of devices has a first and a second input/output (I/O) devices, wherein said first I/O device is powered by a first common voltage level of said common voltage levels and said second I/O device is powered by a second common voltage level of said common voltage levels.

9. The system of claim 8, wherein said each device of said plurality of devices comprises an upward signal path and a downward signal path, and wherein said upward signal path and said down signal path share said first and second I/O devices.

10. The system of claim 7, wherein said each of said common voltage levels is provided by a voltage of at least one cell in said group of cells.

11. The system of claim 7, wherein said each device of said plurality of devices comprises a voltage regulator, and wherein said common voltage levels are provided by the voltage at the positive terminal of one cell in said group of cells and the output voltage of said voltage regulator.

12. The system of claim 8, wherein said I/O devices are open-drain.

13. The system of claim 5, wherein said devices further comprise a plurality of analog-to-digital converters (ADCs) and wherein said common voltage levels are configured to diagnosis said ADCs.

14. The system of claim 5, wherein said each device of said plurality of devices comprises a bus engine, wherein said bus engine uses a default line for signal transmission, and wherein a backup line replaces said default line if said default line becomes unavailable.

15. The system of claim 5, wherein said differential circuit comprises a first switch and a second switch, and wherein said first voltage and said second voltage are a voltage at a node of said first switch and a voltage at a node of said second switch respectively.

16. A method for enabling signal transmission and enabling reduced power consumption management of a battery comprising a rechargeable multi-cell battery pack, said method comprising:
accessing statuses of cells in said battery;
transmitting a signal indicating said statuses between a first common voltage level and a second common voltage level in a first bus block of a plurality of bus blocks;
transmitting said signal by a differential circuit using a voltage difference between a first voltage and a second voltage, wherein said first voltage and said second voltage are determined by said first and second common voltage levels; and
transmitting said signal between said first bus block and a second bus block of said bus blocks, wherein said first and second bus blocks share said second common voltage level.

17. The method of claim 16, further comprising:
converting a first reference voltage to a first value using an accurate first converter;
converting said first reference voltage to a second value using a second converter; and
comparing said first value to said second value for diagnosing said second converter.

18. The method of claim 17, further comprising:
calibrating said second converter according to a result of said comparing;
converting a second reference voltage to a third value using said second converter;

converting said second reference voltage to a fourth value using a third converter; and comparing said third value to said fourth value for diagnosing said third converter.

19. The method of claim 18, wherein said second reference voltage comprises said second common voltage level.

20. The method of claim 16, wherein said first common voltage level is used to power a first input/output (I/O) device in said first bus block, and wherein said second common voltage level is used to power a second I/O device in said first bus block.

\* \* \* \* \*